United States Patent
Lendvay et al.

(10) Patent No.: US 12,181,948 B2
(45) Date of Patent: Dec. 31, 2024

(54) PROGRAMMING POWER MANAGEMENT CIRCUITS IN A SYSTEM

(71) Applicant: Micron Technology, Inc., Boise, ID (US)

(72) Inventors: William A. Lendvay, Boise, ID (US); Paul Zipp, Boise, ID (US); Yoshihisa Fukushima, Hachioji (JP); Mamoru Nagase, Yokohama (JP); Tetsuya Shibata, Sagamihara (JP)

(73) Assignee: Micron Technology, Inc., Boise, ID (US)

( * ) Notice: Subject to any disclaimer, the term of this patent is extended or adjusted under 35 U.S.C. 154(b) by 192 days.

(21) Appl. No.: 17/936,083

(22) Filed: Sep. 28, 2022

(65) Prior Publication Data

US 2024/0103599 A1  Mar. 28, 2024

(51) Int. Cl.
  *G06F 1/32* (2019.01)
  *G06F 1/3234* (2019.01)
  *G11C 5/14* (2006.01)

(52) U.S. Cl.
  CPC .......... *G06F 1/3253* (2013.01); *G06F 1/3275* (2013.01); *G11C 5/14* (2013.01)

(58) Field of Classification Search
  CPC ........ G06F 1/3253; G06F 1/3275; G06F 1/26; G06F 1/263; G06F 1/266
  See application file for complete search history.

(56) References Cited

U.S. PATENT DOCUMENTS

| | | | |
|---|---|---|---|
| 2011/0004748 A1* | 1/2011 | Carroll | G06F 1/3203 713/300 |
| 2016/0124478 A1* | 5/2016 | Beeston | G06F 1/26 713/300 |
| 2017/0363672 A1* | 12/2017 | Kim | G01R 31/52 |
| 2018/0210517 A1* | 7/2018 | Yun | G06F 3/0679 |
| 2019/0278496 A1* | 9/2019 | Rowley | G06F 3/0679 |
| 2020/0097418 A1* | 3/2020 | Lendvay | G06F 13/1668 |
| 2023/0306988 A1* | 9/2023 | Kondo | G11B 5/012 |

* cited by examiner

*Primary Examiner* — Ji H Bae
*Assistant Examiner* — Cheri L Harrington
(74) *Attorney, Agent, or Firm* — Holland & Hart LLP

(57) ABSTRACT

Methods, systems, and devices for programming power management circuits in a system are described. An apparatus may include a set of one or more power management circuits configured to provide one or more operating voltages for the apparatus. The apparatus may also include an interface coupled with a controller via a bus. The apparatus may include a first switching circuit configured to isolate the bus from the controller and to couple the bus with a second switching circuit. The second switching circuit may be configured to isolate the set of one or more power management circuits from the controller and to couple the set of one or more power management circuits with the first switching circuit.

22 Claims, 6 Drawing Sheets

PROGRAMMING POWER MANAGEMENT CIRCUITS IN A SYSTEM

FIELD OF TECHNOLOGY

The following relates to one or more systems for memory, including programming power management circuits in a system.

BACKGROUND

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read (e.g., sense, detect, retrieve, identify, determine, evaluate) a stored state in the memory device. To store information, a component may write (e.g., program, set, assign) the state in the memory device.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), self-selecting memory, chalcogenide memory technologies, not- or (NOR) and not- and (NAND) memory devices, and others. Memory cells may be described in terms of volatile configurations or non-volatile configurations. Memory cells configured in a non-volatile configuration may maintain stored logic states for extended periods of time even in the absence of an external power source. Memory cells configured in a volatile configuration may lose stored states when disconnected from an external power source.

DETAILED DESCRIPTION

A system may include power management circuits (e.g., power management integrated circuits (PMICs)) that provide regulated operating voltage(s) to other components of the system. To ensure usability of the operating voltages, the power management circuits may be programmed to output the correct voltage levels for the system. But a system that uses power management circuits may not support programming of the power management circuits, in which case the power management circuits may be pre-programmed by the manufacturer of the power management circuits. In such cases, programming a PMIC differently may be the only difference between two memory systems. The ability to program PMICs in a memory system after manufacturing may allow a single, base memory system to be distributed for different purposes. For example, if a first system uses a first type of programmed PMIC and a second system uses a second type of programmed PMIC, multiple different systems (e.g., systems of different stock-keeping units (SKUs)) may be distributed or obtained from the manufacture, which may increase cost and overhead.

According to the aspects described herein, a system may include circuitry that allows another device (e.g., a programming device) to program power management circuits that are integrated into the system. For example, the system may include switching circuits that are configured to isolate the power management circuits from a controller of the system and to couple the power management circuits with a programming bus (e.g., an inter-integrated circuit (I2C) or improved inter-integrated circuit (I3C) bus) that is accessible to the programming device. Thus, the programming device may program the power management circuits after the power management circuits are integrated into the system, which may reduce cost and overhead associated with the use of power management circuits that are pre-programmed by the manufacturer. After programming the PMIC is complete, the switching circuits may isolate the PMIC from the programming bus and couple the PMIC with the controller for normal operation.

Features of the disclosure are initially described in the context of systems as described with reference to FIGS. 1 and 2. Features of the disclosure are described in the context of a system and a process flow as described with reference to FIGS. 3 through 4. These and other features of the disclosure are further illustrated by and described with reference to an apparatus diagram and flowcharts that relate to programming power management circuits in a system as described with reference to FIGS. 5 through 6.

Figure 1:
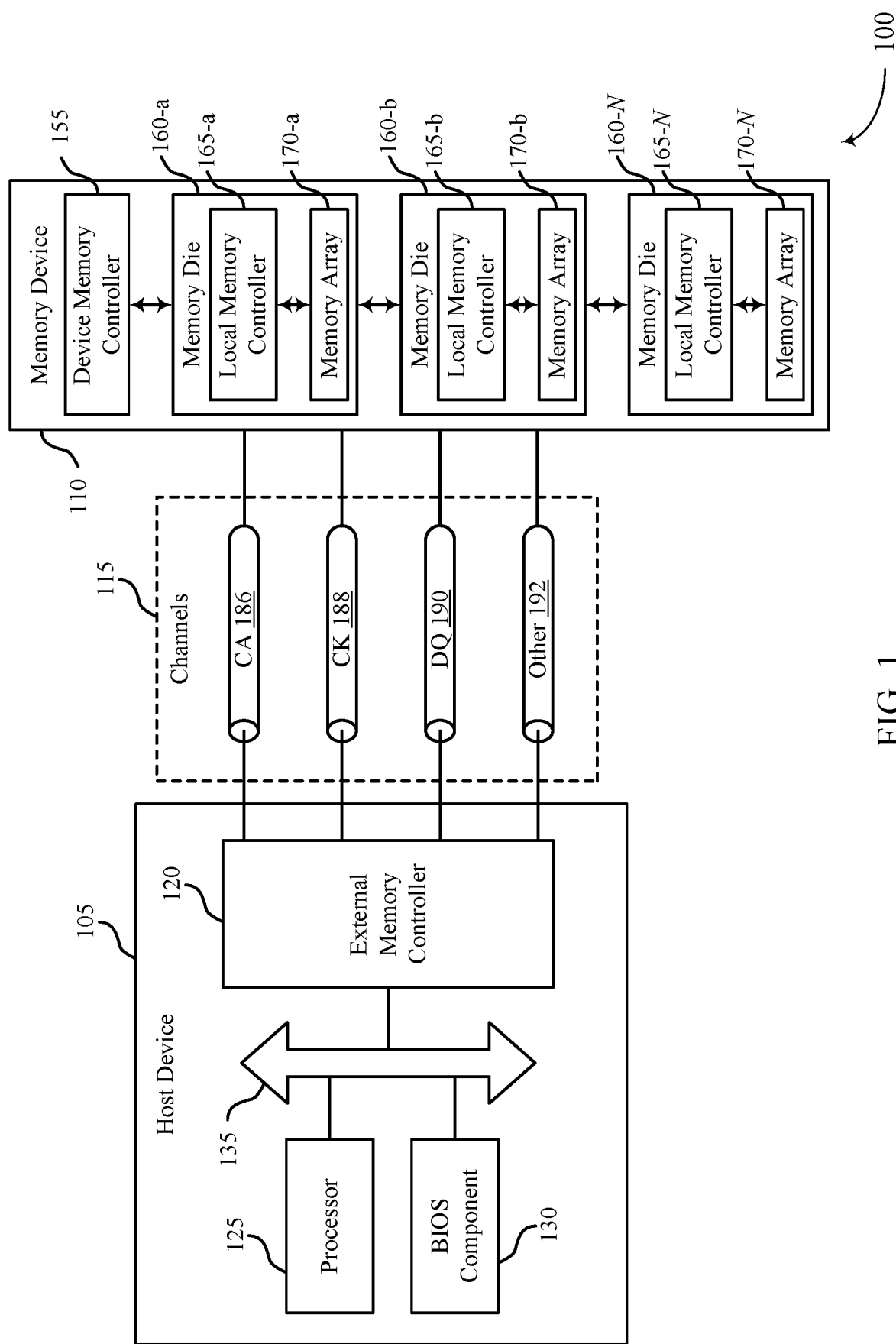
FIG. 1 illustrates an example of a system that supports programming power management circuits in accordance with examples as disclosed herein.

FIG. 1 illustrates an example of a system 100 that supports programming power management circuits in a system in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a server, a data center, computer, a laptop computer, a tablet computer, a smartphone, a cellular phone, a wearable device, an internet-connected device, a vehicle controller, or the like. The memory device 110 may be a component of the system 100 that is operable to store data for one or more other components of the system 100.

Portions of the system 100 may be examples of the host device 105. The host device 105 may be an example of a processor (e.g., circuitry, processing circuitry, a processing component) within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or any combination thereof that implements the functions of an external memory controller 120. In some examples, the external memory controller 120 may be referred to as a host (e.g., host device 105).

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other functions.

The memory device 110 may be operable to store data for the components of the host device 105. In some examples, the memory device 110 (e.g., operating as a secondary-type device to the host device 105, operating as a dependent-type device to the host device 105) may respond to and execute commands provided by the host device 105 through the external memory controller 120. Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of the host device 105 may be coupled with one another using a bus 135.

The processor 125 may be operable to provide functionality (e.g., control functionality) for the system 100 or the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or any combination of these components. In such examples, the processor 125 may be an example of a central processing unit (CPU), a graphics processing unit (GPU), a general purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include instructions (e.g., a program, software) stored in one or more of read-only memory (ROM), flash memory, or other non-volatile memory.

The memory device 110 may include a device memory controller 155 and one or more memory dies 160 (e.g., memory chips) to support a capacity (e.g., a desired capacity, a specified capacity) for data storage. Each memory die 160 (e.g., memory die 160-a, memory die 160-b, memory die 160-N) may include a local memory controller 165 (e.g., local memory controller 165-a, local memory controller 165-b, local memory controller 165-N) and a memory array 170 (e.g., memory array 170-a, memory array 170-b, memory array 170-N). A memory array 170 may be a collection (e.g., one or more grids, one or more banks, one or more tiles, one or more sections) of memory cells, with each memory cell being operable to store one or more bits of data. A memory device 110 including two or more memory dies 160 may be referred to as a multi-die memory or a multi-die package or a multi-chip memory or a multi-chip package.

The device memory controller 155 may include components (e.g., circuitry, logic) operable to control operation of the memory device 110. The device memory controller 155 may include hardware, firmware, or instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

In some examples, the memory device 110 may communicate information (e.g., data, commands, or both) with the host device 105. For example, the memory device 110 may receive a write command indicating that the memory device 110 is to store data received from the host device 105, or receive a read command indicating that the memory device 110 is to provide data stored in a memory die 160 to the host device 105, among other types of information communication.

A local memory controller 165 (e.g., local to a memory die 160) may include components (e.g., circuitry, logic) operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165 or the external memory controller 120 may perform various functions described herein. As such, a local memory controller 165 may be operable to communicate with the device memory controller 155, with other local memory controllers 165, or directly with the external memory controller 120, or the processor 125, or any combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other components operable for supporting described operations of the device memory controller 155 or local memory controller 165 or both.

The external memory controller 120 may be operable to enable communication of information (e.g., data, commands, or both) between components of the system 100 (e.g., between components of the host device 105, such as the processor 125, and the memory device 110). The external memory controller 120 may process (e.g., convert, translate) communications exchanged between the components of the host device 105 and the memory device 110. In some examples, the external memory controller 120, or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be an example of a transmission medium that carries information between the host device 105 and the memory device 110. Each channel 115 may include one or more signal paths (e.g., a transmission medium, a conductor) between terminals associated with the components of the system 100. A signal path may be an example of a conductive path operable to carry a signal. For example, a channel 115 may be associated with a first terminal (e.g., including one or more pins, including one or more pads) at the host device 105 and a second terminal at the memory device 110. A terminal may be an example of a conductive input or output point of a device of the system 100, and a terminal may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or any combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

Although shown as discrete device, in some examples, the memory device 110 may be a memory module that is included in a memory system that includes an interface, such as a compute express link (CXL) interface, for communicating with the host device 105. An interface may be a collection of circuitry that is sharable between two devices and that enables the exchange of information between the components.

The components of the memory system may use various operating voltages to function, where an operating voltage is a voltage that enables operation of one or more components. Accordingly, the memory system may include power management circuits (e.g., PMICs) that provide regulated operating voltages for the components of the memory system. To enable programming of the power management circuits, the memory system may include switching components that selectively couple power management circuits to a programming bus while isolating the power management circuits from a controller that controls various components of the memory system. Thus, the power management circuits may be programmed for the memory system after integration with the memory system, which may reduce the expense and overhead associated with the use of power management circuits that are pre-programmed by the manufacturer.

Figure 2:
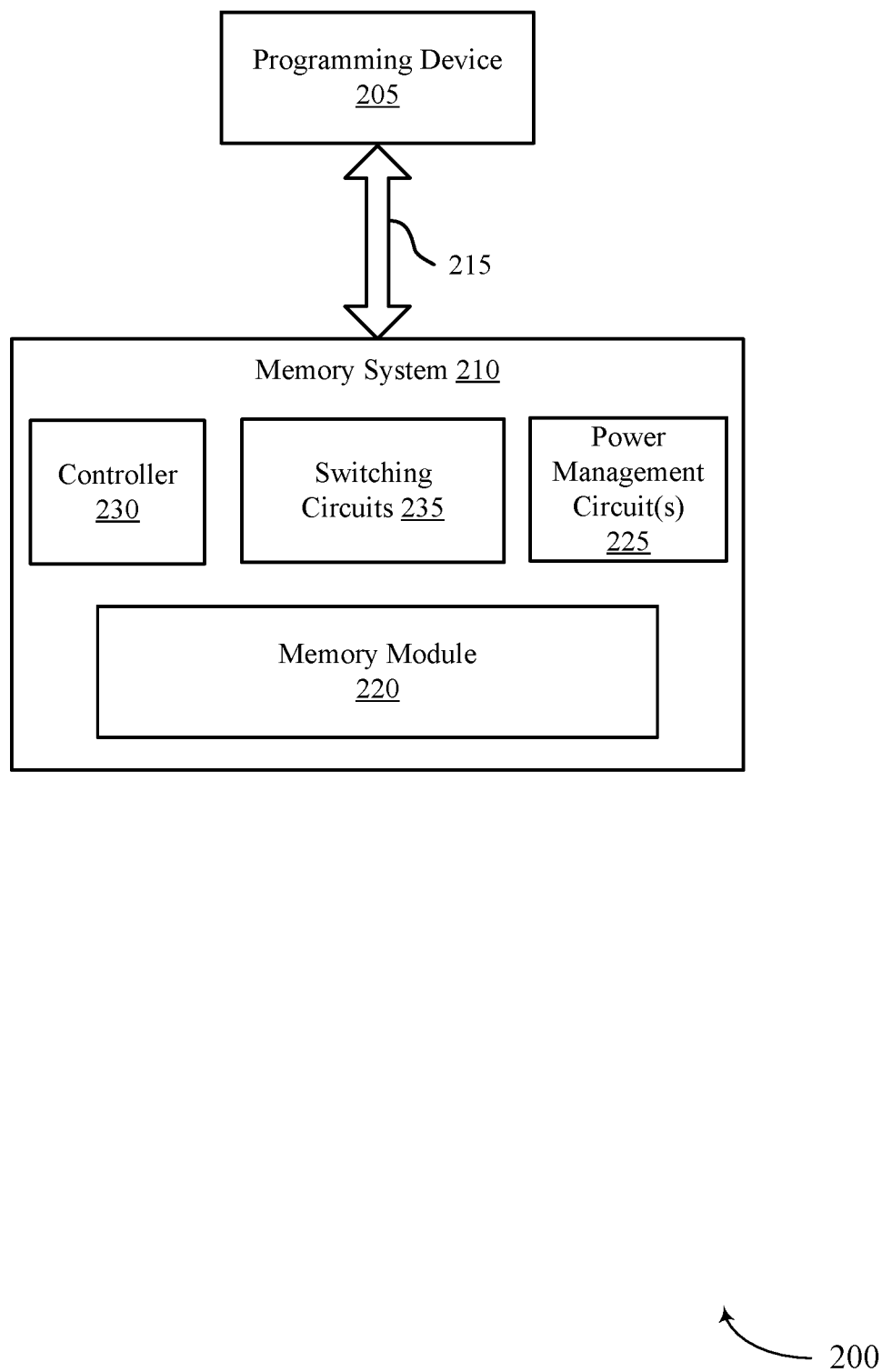
FIG. 2 illustrates an example of a system that supports programming power management circuits in accordance with examples as disclosed herein.

FIG. 2 illustrates an example of a system 200 that supports programming power management circuits in a system in accordance with examples as disclosed herein. The system 200 may include a programming device 205 and a memory system 210. The programming device 205 and the memory system 210 may communicate via the interface 215, which in some examples may be a CXL interface that uses a Peripheral Component Interconnect express (PCIe) protocol. The memory system 210 may include a memory module 220, which may include one or more memory device 110 as described with reference to FIG. 1.

The programming device 205 may be coupled with the memory system 210 so that the memory system can be programmed by an entity in a manufacturing chain, which may include multiple entities that build or assemble different portions of the memory system 210. In some examples, a manufacturing entity may assemble a portion of the memory system 210 and then couple the memory system 210 with programming equipment or test equipment. The configuration of the memory system 210 as described herein may enable programming of the power management circuits 225 (which may otherwise be impossible) by providing a configurable communication path for programming signals. For example, the switching circuits 235 and related components may provide a configurable communication path between the programming device 205 and the power management circuits 225 (which may not exist in other memory systems), thereby enabling programming of the power management circuits 225 by the programming device 205 at later stages in the manufacturing process than would otherwise be possible.

The memory system 210 may include one or more power management circuits 225 that are configured to provide operating voltages to various components of the memory system 210. For example, the power management circuits 225 may provide one or more operating voltages to the memory module 220, may provide one or more operating voltages to the controller 230, or both, among other components. The controller 230 (e.g., an ASIC) may be configured to control the operations of various components of the memory system 210. For example, the controller 230 may be configured to control the memory module 220, the power management circuits 225, or both, among other components of the memory system 210.

To enable programming of the power management circuits 225, which may be non-functional until programmed, the memory system 210 may include switching circuits 235 that enable and disable conductive paths within the memory system 210. For example, the switching circuits 235 may be activated to couple the power management circuits 225 with a programming bus (e.g., an I2C bus, an I3C bus) that is coupled with the interface 215 so that the programming device 205 can communicate programming signals to the power management circuits 225. An I2C or I3C bus may be a synchronous, multi-controller/multi-target (controller/target), packet-switched, single-ended, serial communication bus that includes one pin for clock signals and one pin for data signals.

In addition to coupling the power management circuits 225 with the programming bus, the switching circuits 235 may also isolate the power management circuits 225 from the controller 230 so that controller 230 (which may be inoperable until provided with power from the power management circuits) doesn't interfere with the programming signals. The configuration of the switching circuits 235 that enables programming of the power management circuits (e.g., the configuration that couples the power management circuits 225 with the bus and that isolates the power management circuits 225 from the controller 230) may be referred to as the programming-support configuration.

Components may be "isolated" if signals are not presently capable of flowing between the components (e.g., due to an open-circuit relationship between the components). Components are "coupled" if signals are capable of being communicated between components (e.g., via a conductive path between the components).

The switching circuits 235 may be at least partially controlled by a pin, such as a manufacturing (MFG) pin, of the interface 215. For example, the switching circuits 235 may be activated into the programming-support configuration in response to a first voltage level being applied to the manufacturing pin. And the switching circuits 235 may be activated into a non-programming-support configuration (e.g., a configuration that isolates the power management circuits 225 from the bus and that couples the power management circuits 225 with the controller 230) in response to a second voltage level being applied to the manufacturing pin. A manufacturing pin may be a pin that is not assigned any particular function by the manufacturer of the memory system 210 or the interface 215. Additionally or alternatively, a manufacturing pin may have a different purpose in a different context and such a pin may be re-used or re-purposed (at least temporarily) for programming the power management circuits 225.

To program the power management circuits 225, the programming device 205 may apply the first voltage level to the manufacturing pin so that the switching circuits 235 are activated into the programming-support configuration. The programming device 205 may then communicate programming signals (e.g., I2C commands, I3C commands) to the power management circuits 225 to program the power management circuits 225 with the desired parameters (e.g., operating voltage levels) for the memory system 210. Upon determining that the power management circuits 225 are successfully programmed, the programming device 205 may apply the second voltage to the manufacturing pin so that the switching circuits 235 are activated into the non-programming-support configuration. To prevent inadvertent re-programming of the power management circuits 225, and to free up the manufacturing pin for other purposes, the memory system 210 may enter a lockout mode in which a buffer gate is enabled so that the manufacturing pin is unable to activate the switching circuits 235 into the programming-support configuration.

Thus, the programming device 205 and the memory system 210 may enable programming of the power management circuits 225.

Figure 3:
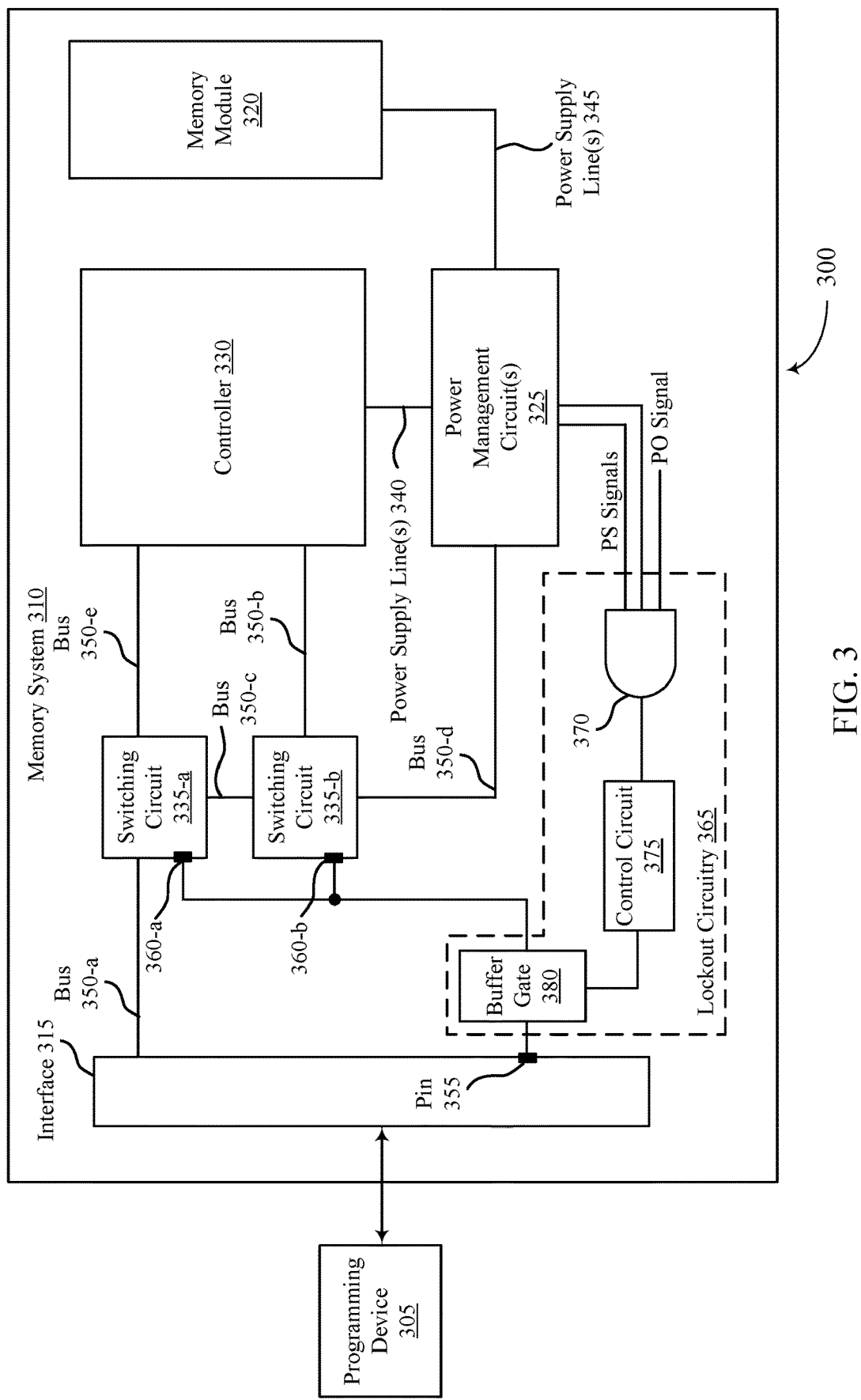
FIG. 3 illustrates an example of a system that supports programming power management circuits in accordance with examples as disclosed herein.

FIG. 3 illustrates an example of a system 300 that supports programming power management circuits in a system in accordance with examples as disclosed herein. The system 300 may include a programming device 305 and a memory system 310. The programming device 305 and the memory system 310 may communicate via the interface 315, which in some examples may be a CXL interface. The memory system 310 may include a memory module, power management circuits 325, a controller 330, and switching circuits 335, which may be examples of corresponding devices as described with reference to FIG. 2. The switching circuits 335 may be configured to enable programming of the power management circuits 325, which may allow the power management circuits 325 to be integrated into the memory system 310 before the power management circuits are programmed.

The interface 315 may include a pin 355, such as a manufacturing pin, and may be coupled with a bus 350-*a* that supports the communication of various signals, including programming signals. The pin 355 may be coupled with control terminals of the switching circuits 335-*a*. For example, the pin 355 may be coupled with a control terminal 360-*a* of the switching circuit 335-*a* and may be coupled with a control terminal 360-*b* of the switching circuit 335-*b*.

To program the power management circuits 325, the programming device 305 may apply a first voltage level to the pin 355 so that the switching circuits 335 are activated into the programming-support configuration. For instance, the switching circuit 335-*a* may isolate the bus 350-*a* from the controller 330 (and from bus 350-*e*) and may couple the bus 350-*a* with the switching circuit 335-*b* via bus 350-*c*. And the switching circuit 335-*b* may isolate the power management circuits 325 from the controller 330 (and from the bus 350-*b*) and may couple the power management circuits 325 with the switching circuit 335-*a* (via bus 350-*d*). Thus, a conductive path may be established between the interface 315 and the power management circuits 325. Isolation of the bus 350-*a* and the power management circuits 325 from the controller 330 may prevent the unenergized controller 330 from negatively interfering with the communication of programming signals that are conveyed from the programming device 305 to the power management circuits 325 via the switching circuits 335.

Although shown with a single transmission line, the buses 350 may each include multiple transmission lines, such as a transmission line for clock signals and a transmission line for data signals. So, each switching circuit 335 may include multiple switching components for coupling the transmission lines of the buses.

After the power management circuits 325 have been successfully programmed, the programming device 305 may apply a second voltage level to the pin 355 so that the switching circuits 335 are activated into the non-programming-support configuration. For instance, the switching circuit 335-*a* may couple the bus 350-*a* with the controller 330 (e.g., via the bus 350-*e*) and may isolate the bus 350-*a* from the switching circuit 335-*b* (and bus 350-*c*). Further, the switching circuit 335-*b* may couple the power management circuits 325 with the controller 330 (and the bus 350-*b*) and may isolate the power management circuits 325 from the switching circuit 335-*a* (and the bus 350-*c*). The non-programming-support configuration may enable communication of control signals to the controller 330 (e.g., from a host device) via the bus 350-*a* and may enable communication of control signals from the controller 330 to the power management circuits 325 via the bus 350-*b*.

After being successfully programmed, the power management circuits 325 may provide operating voltages to the components of the memory system 310. For example, the power management circuits 325 may provide one or more operating voltages to the controller 330 via the power supply line(s) 340. Additionally or alternatively, the power management circuits 325 may provide one or more operating voltages to the memory module 320 via the power supply line(s) 345.

The controller 330 may control various components of the memory system 310, such as the power management circuits 325, the memory module 320, or both. In some examples, the controller 330 may control the components of the memory system 310 based on information communicated from a host device to the controller 330 via the bus 350-a. In some examples, the controller 330 may control the power management circuits 325 by sending control signals to the power management circuits 325 via the bus 350-b.

In some examples, the memory system 310 may include lockout circuitry 365 that allows the pin 355 to be used for other purposes and prevents the power management circuits 325 from being accidentally programmed (or incorrectly over-written). At a high level, the lockout circuitry 365 may detect if the power management circuits 325 have been successfully programmed and, if so, may isolate the pin 355 from the switching circuits 335 so that subsequent voltage applications to the pin 355 do not cause the switching circuits 335-a to be activated into the programming-support configuration. The lockout circuitry 365 may be configured so that the isolation of the pin 355 from the switching circuits 335 is permanent (e.g., if a fuse is blown). Alternatively, the lockout circuitry 365 may be configured so the pin 355 can be re-coupled with the switching circuits 335 (e.g., for re-programming the power management circuits 325).

The lockout circuitry 365 may include a logic gate 370, a control circuit 375, and a buffer gate 380. The logic gate 370 may be an AND gate that is configured to receive control signals from the power management circuits 325, referred to as "program success" signals (denoted "PS"), that indicate whether the power management circuits 325 have been successfully programmed. For example, the power success signal for a power management circuit 325 may be a logic 0 if the power management circuit 325 is not programmed and may be a logic 1 if the power management circuit 325 is successfully programmed. The logic gate 370 may also be configured to receive a "power on" signal from a fuse circuit (denoted "PO") that indicates whether the supply voltage for the memory system 310 is enabled. The logic gate 370 may output a low signal (e.g., a logic 0) unless each input signal is a logic 1, in which case the logic gate 370 may output a high signal (e.g., a logic 1).

The control circuit 375 may be configured to modify its output signal based on the output signal from the logic gate 370. For example, the control circuit 375 may output a first voltage level if the logic gate 370 outputs a logic 0 and may output a second voltage level if the logic gate outputs a logic 1. The output signal from the control circuit 375 may control the buffer gate 380, which may be activated into A) an open circuit state (e.g., where the output node of the buffer gate 380 is disconnected from the input node) if the second voltage level is applied to the buffer gate 380, or B) a closed-circuit state (e.g., where the output node of the buffer gate 380 is connected to the input node) if the first voltage level is applied to the buffer gate 380. So, the buffer gate 380 may isolate the pin 355 from the switching circuits 335 in response to the power management circuits 325 being successfully programmed.

Thus, the programming device 305 and the memory system 310 may enable programming of the power management circuits 325.

Figure 4:
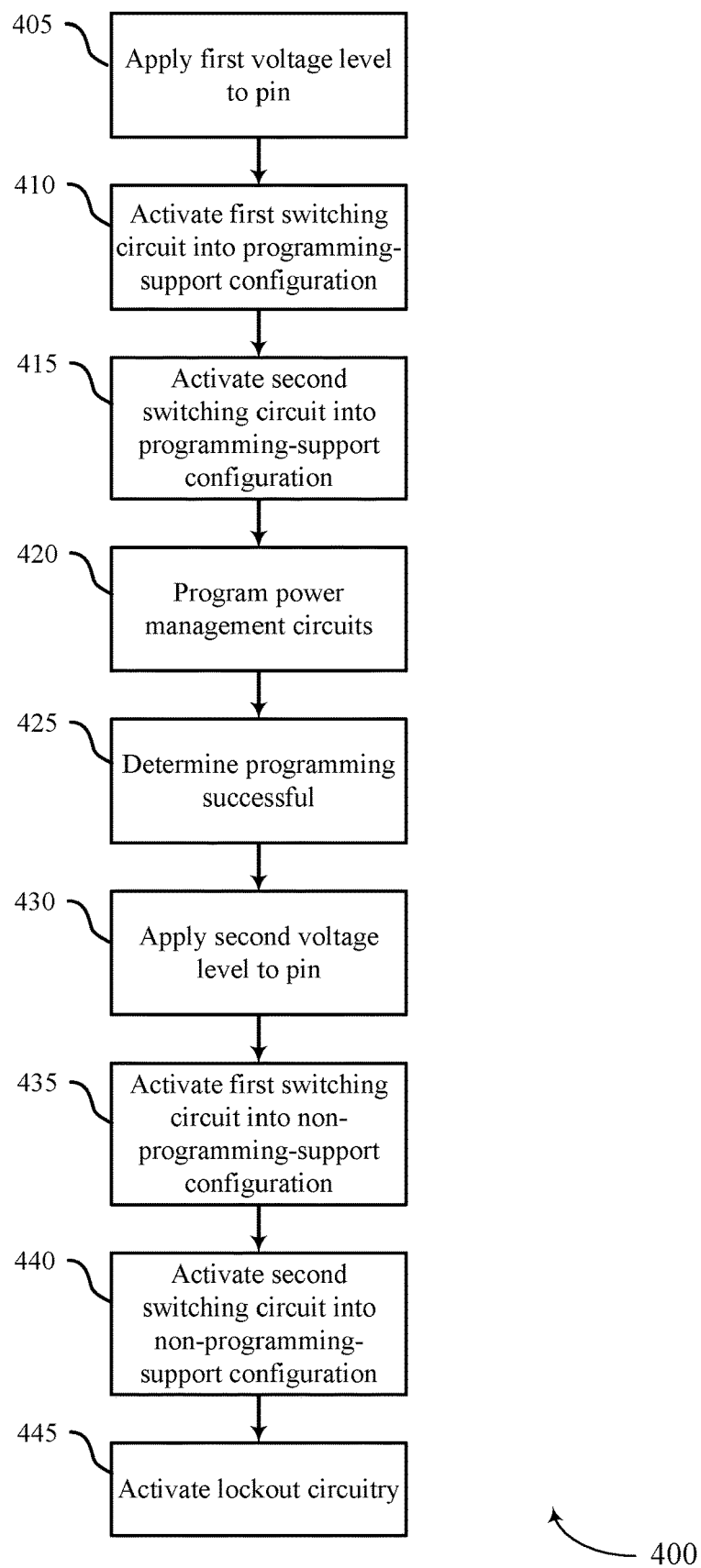
FIG. 4 illustrates an example of a process flow that supports programming power management circuits in a system in accordance with examples as disclosed herein.

FIG. 4 illustrates an example of a process flow 400 that supports programming power management circuits in a system in accordance with examples as disclosed herein. Aspects of the process flow 400 may be implemented by system such as the system 200 or the system 300 as described herein. Implementation of the process flow 400 may allow the system to program power management circuits in a memory system of the system.

At 405, a first voltage level may be applied (e.g., by the programming device 305) to a pin of an interface (e.g., the pin 355 of the interface 315) of a memory system (e.g., the memory system 310). At 410, a first switching circuit (e.g., switching circuit 335-a) may be activated into the programming-support configuration based on (e.g., in response to) the first voltage level being applied to the pin. For example, the switching circuit 335-a may isolate the bus 350-a from the controller 330 and may couple the bus 350-a with a second switching circuit (e.g., switching circuit 335-b). So, activating the first switching circuit into the programming-support configuration may establish a conductive path between the bus 350-a and the switching circuit 335-b.

At 415, a second switching circuit (e.g., switching circuit 335-b) may be activated into the programming-support configuration based on (e.g., in response to) the first voltage level being applied to the pin. For example the switching circuit 335-b may isolate the power management circuits 325 from the controller 330 and may couple the power management circuits 325 with the first switching circuit (e.g., switching circuit 335-a). So, activating the second switching circuit into the programming-support configuration may establish a conductive path between the switching circuit 335-a and the power management circuits 325. Together, activating the first and second switching circuits into the programming-support configuration may establish a conductive path between the bus 350-a and the power management circuits 325. In some examples the operations at 410 and 415 may occur concurrently (e.g., at the same time or at overlapping times).

At 420, the power management circuits 325 may be programmed (e.g., by the programming device 305). For example, the programming device 305 may program the power management circuits 325 by communicating programming signals to the power management circuits via the switching circuit 335-a and the switching circuit 335-b.

At 425, it may be determined that power management circuits have been successfully programmed. For example, the programming device 305 may determine (e.g., based on signaling from the memory system 310) that the power management circuits 325 have been successfully programmed. Additionally or alternatively, the memory system 310 may determine that the power management circuits 325 have been successfully programmed. A power management circuit is considered successfully programmed if the power management circuit outputs the appropriate voltage level for an operating voltage.

In some examples, programming information for the power management circuits 325 may be communicated to the programming device 305 after the power management circuits 325 have been programmed. In such examples, the programming device 305 may cause the memory system 310 to reboot (e.g., cycle the power) before 430.

At 430, a second voltage level may be applied (e.g., by the programming device 305) to the pin of the interface. For example, the programming device 305 may apply the second voltage to the pin based on (e.g., in response to) determining that the power management circuits have been successfully programmed (and potentially that the memory system 310 has been rebooted).

At 435, the first switching circuit (e.g., switching circuit 335-a) may be activated into the non-programming-support configuration based on (e.g., in response to) the second voltage level being applied to the pin. For example, the switching circuit 335-*a* may couple the bus 350-*a* with the controller 330 and may isolate the bus 350-*a* from the second switching circuit (e.g., switching circuit 335-*b*). So, activating the first switching circuit into the non-programming-support configuration may establish a conductive path between the bus 350-*a* and the controller 330.

At 440, the second switching circuit (e.g., switching circuit 335-*b*) may be activated into the non-programming-support configuration based on (e.g., in response to) the second voltage level being applied to the pin. For example the switching circuit 335-*b* may couple the power management circuits 325 with the controller 330 and may isolate the power management circuits 325 from the first switching circuit (e.g., switching circuit 335-*a*). So, activating the second switching circuit into the non-programming-support configuration may establish a conductive path between the power management circuits 325 and the controller 330. In some examples the operations at 435 and 440 may occur concurrently (e.g., at the same time or at overlapping times).

At 445, the lockout circuitry 365 may be activated (e.g., by the memory system 310). For example, the logic gate 370 may trigger (e.g., based on programming success signals) the control circuit 375 into enabling the buffer gate 380 so that the buffer gate 380 isolates the pin 355 from the switching circuits 335. Among other advantages, isolating the pin 355 from the switching circuits 335 may allow the memory system 310 to use the pin 355 from some purposes other than programming the power management circuits 325.

Thus, implementation of the process flow 400 may allow the system to program power management circuits in a memory system of the system. Alternative examples of the foregoing may be implemented, where some operations are performed in a different order than described, are performed in parallel, or are not performed at all. In some cases, operations may include additional features not mentioned herein, or further operations may be added. Additionally, certain operations may be performed multiple times or certain combinations of operations may repeat or cycle.

Figure 5:
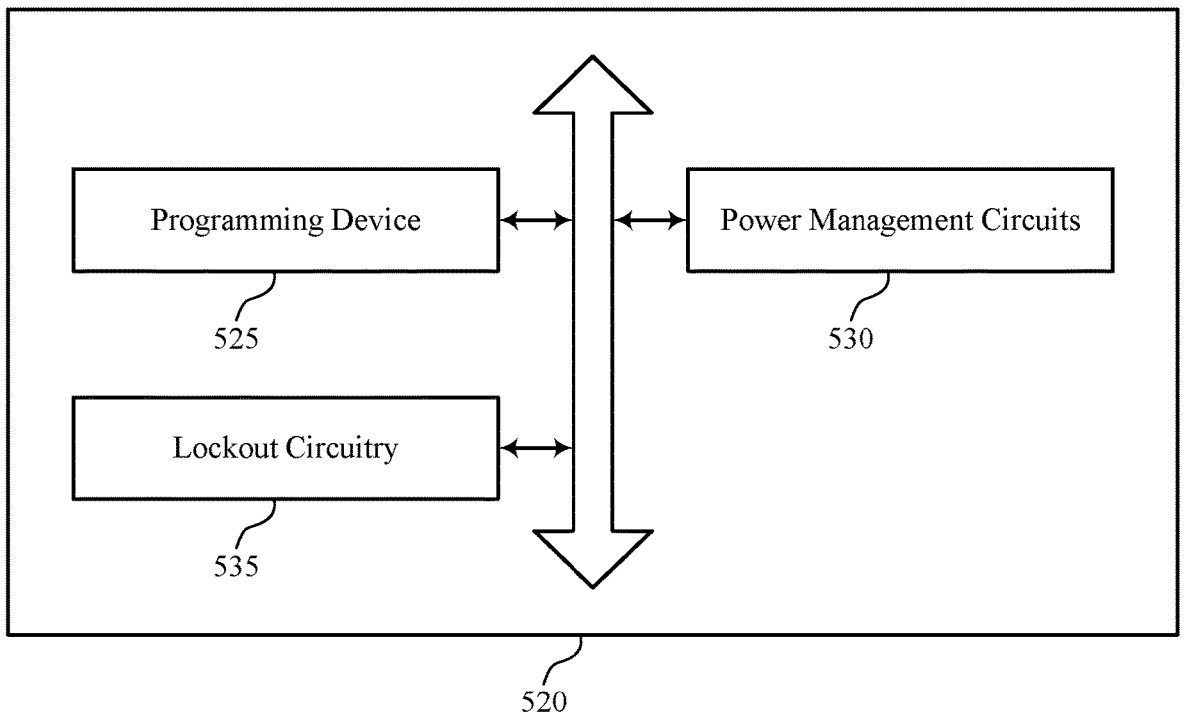
FIG. 5 shows a block diagram of a memory system that supports programming power management circuits in a system in accordance with examples as disclosed herein.

FIG. 5 shows a block diagram 500 of a memory system 520 that supports programming power management circuits in a system in accordance with examples as disclosed herein. The memory system 520 may be an example of aspects of a memory system as described with reference to FIGS. 1 through 4. The memory system 520, or various components thereof, may be an example of means for performing various aspects of programming power management circuits in a system as described herein. For example, the memory system 520 may include a programming device 525, a power management circuits 530, a lockout circuitry 535, or any combination thereof. Each of these components may communicate, directly or indirectly, with one another (e.g., via one or more buses).

The programming device 525 may be configured as or otherwise support a means for activating a first switching circuit to isolate a bus from a controller and to couple the bus with a second switching circuit. In some examples, the programming device 525 may be configured as or otherwise support a means for activating, based on activating the first switching circuit, the second switching circuit to isolate a set of one or more power management circuits from the controller and to couple the set of one or more power management circuits with the first switching circuit. In some examples, the programming device 525 may be configured as or otherwise support a means for programming the set of one or more power management circuits using signals communicated via the bus based on activating the first switching circuit and the second switching circuit.

In some examples, the bus is coupled with an interface, and the programming device 525 may be configured as or otherwise support a means for applying a first voltage to a pin, of the interface, that is coupled with the first switching circuit and the second switching circuit, where the first switching circuit and the second switching circuit are activated based on applying the first voltage to the pin.

In some examples, the lockout circuitry 535 may be configured as or otherwise support a means for isolating the pin from the first switching circuit and the second switching circuit based on determining that the set of one or more power management circuits has been successfully programmed.

In some examples, the programming device 525 may be configured as or otherwise support a means for applying a second voltage to the pin based at least in part on determining that the set of one or more power management circuits has been successfully programmed. In some examples, the programming device 525 may be configured as or otherwise support a means for activating, based at least in part on applying the second voltage, the first switching circuit to couple the bus with the controller and to isolate the bus from the second switching circuit.

In some examples, the programming device 525 may be configured as or otherwise support a means for activating, based at least in part on applying the second voltage, the second switching circuit to couple the set of one or more power management circuits with the controller and to isolate the set of one or more power management circuits from the first switching circuit.

In some examples, the programming device 525 may be configured as or otherwise support a means for activating, based on determining that the set of one or more power management circuits has been successfully programmed, the first switching circuit to isolate the set of one or more power management circuits from the bus and to couple the bus with the controller.

In some examples, the programming device 525 may be configured as or otherwise support a means for activating, based on determining that the set of one or more power management circuits has been successfully programmed, the second switching circuit to isolate the set of one or more power management circuits from the first switching circuit and to couple the second switching circuit with the controller.

In some examples, the power management circuits 530 may be configured as or otherwise support a means for providing a first operating voltage from a first power management circuit of the set of one or more power management circuits to a memory array.

In some examples, the power management circuits 530 may be configured as or otherwise support a means for providing a second operating voltage from a second power management circuit of the set of one or more power management circuits to the controller.

In some examples, activating the second switching circuit isolates the set of one or more power management circuits from a second bus coupled with the controller and the second switching circuit.

Figure 6:
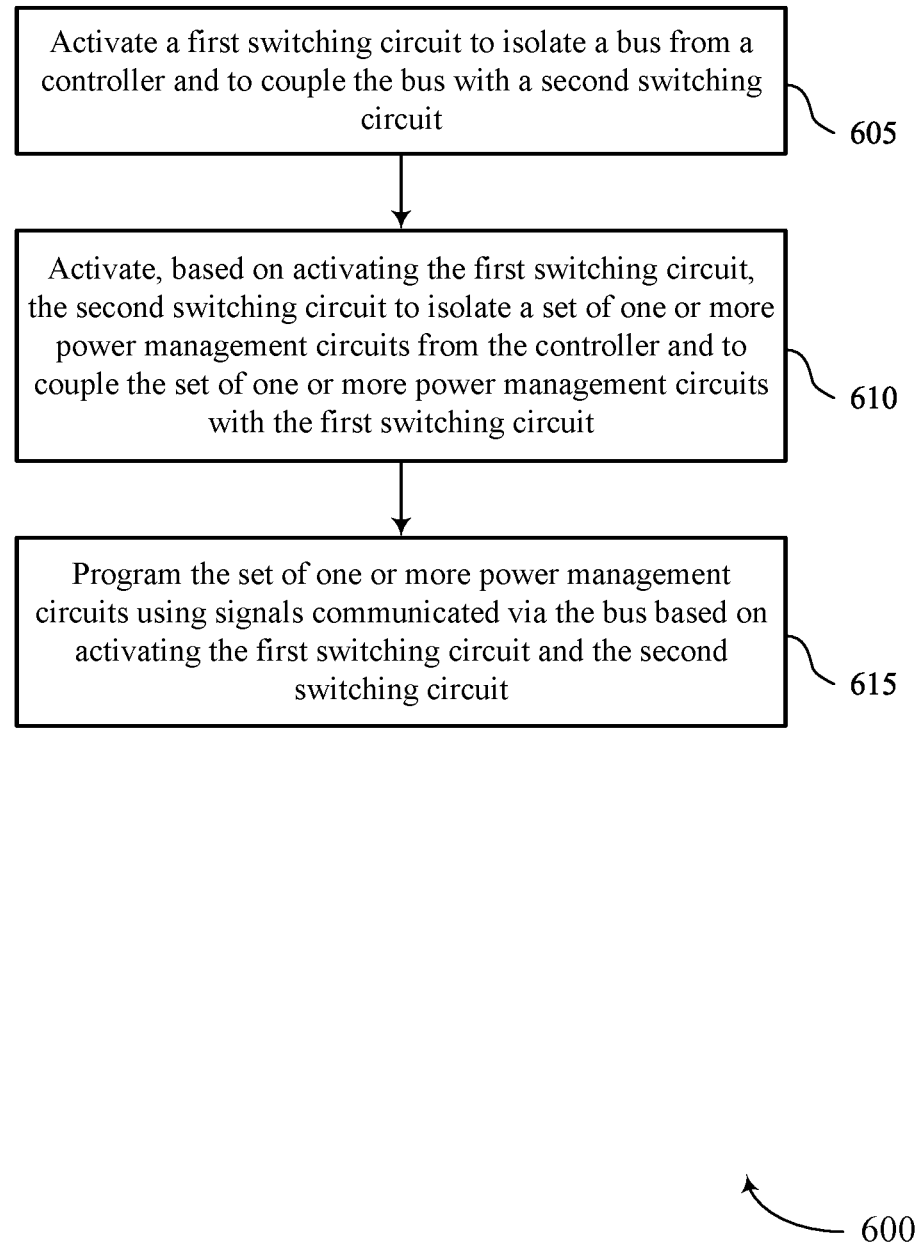
FIG. 6 shows a flowchart illustrating a method or methods that support programming power management circuits in a system in accordance with examples as disclosed herein.

FIG. 6 shows a flowchart illustrating a method 600 that supports programming power management circuits in a system in accordance with examples as disclosed herein. The operations of method 600 may be implemented by a memory system or its components as described herein. For example, the operations of method 600 may be performed by a memory system as described with reference to FIGS. 1 through 5. In some examples, a memory system may execute a set of instructions to control the functional elements of the device to perform the described functions. Additionally, or alternatively, the memory system may perform aspects of the described functions using special-purpose hardware.

At 605, the method may include activating a first switching circuit to isolate a bus from a controller and to couple the bus with a second switching circuit. The operations of 605 may be performed in accordance with examples as disclosed herein. In some examples, aspects of the operations of 605 may be performed by a programming device 525 as described with reference to FIG. 5.

At 610, the method may include activating, based on activating the first switching circuit, the second switching circuit to isolate a set of one or more power management circuits from the controller and to couple the set of one or more power management circuits with the first switching circuit. The operations of 610 may be performed in accordance with examples as disclosed herein. In some examples, aspects of the operations of 610 may be performed by a programming device 525 as described with reference to FIG. 5.

At 615, the method may include programming the set of one or more power management circuits using signals communicated via the bus based on activating the first switching circuit and the second switching circuit. The operations of 615 may be performed in accordance with examples as disclosed herein. In some examples, aspects of the operations of 615 may be performed by a programming device 525 as described with reference to FIG. 5.

In some examples, an apparatus as described herein may perform a method or methods, such as the method 600. The apparatus may include features, circuitry, logic, means, or instructions (e.g., a non-transitory computer-readable medium storing instructions executable by a processor), or any combination thereof for performing the following aspects of the present disclosure:

Aspect 1: A method, apparatus, or non-transitory computer-readable medium including operations, features, circuitry, logic, means, or instructions, or any combination thereof for activating a first switching circuit to isolate a bus from a controller and to couple the bus with a second switching circuit; activating, based on activating the first switching circuit, the second switching circuit to isolate a set of one or more power management circuits from the controller and to couple the set of one or more power management circuits with the first switching circuit; and programming the set of one or more power management circuits using signals communicated via the bus based on activating the first switching circuit and the second switching circuit.

Aspect 2: The method, apparatus, or non-transitory computer-readable medium of aspect 1, where the bus is coupled with an interface and the method, apparatuses, and non-transitory computer-readable medium further includes operations, features, circuitry, logic, means, or instructions, or any combination thereof for applying a first voltage to a pin, of the interface, that is coupled with the first switching circuit and the second switching circuit, where the first switching circuit and the second switching circuit are activated based on applying the first voltage to the pin.

Aspect 3: The method, apparatus, or non-transitory computer-readable medium of aspect 2, further including operations, features, circuitry, logic, means, or instructions, or any combination thereof for isolating the pin from the first switching circuit and the second switching circuit based on determining that the set of one or more power management circuits has been successfully programmed.

Aspect 4: The method, apparatus, or non-transitory computer-readable medium of any of aspects 2 through 3, further including operations, features, circuitry, logic, means, or instructions, or any combination thereof for applying a second voltage to the pin based at least in part on determining that the set of one or more power management circuits has been successfully programmed and activating, based at least in part on applying the second voltage, the first switching circuit to couple the bus with the controller and to isolate the bus from the second switching circuit.

Aspect 5: The method, apparatus, or non-transitory computer-readable medium of aspect 4, further including operations, features, circuitry, logic, means, or instructions, or any combination thereof for activating, based at least in part on applying the second voltage, the second switching circuit to couple the set of one or more power management circuits with the controller and to isolate the set of one or more power management circuits from the first switching circuit.

Aspect 6: The method, apparatus, or non-transitory computer-readable medium of any of aspects 1 through 5, further including operations, features, circuitry, logic, means, or instructions, or any combination thereof for activating, based on determining that the set of one or more power management circuits has been successfully programmed, the first switching circuit to isolate the set of one or more power management circuits from the bus and to couple the bus with the controller.

Aspect 7: The method, apparatus, or non-transitory computer-readable medium of aspect 6, further including operations, features, circuitry, logic, means, or instructions, or any combination thereof for activating, based on determining that the set of one or more power management circuits has been successfully programmed, the second switching circuit to isolate the set of one or more power management circuits from the first switching circuit and to couple the second switching circuit with the controller.

Aspect 8: The method, apparatus, or non-transitory computer-readable medium of any of aspects 1 through 7, further including operations, features, circuitry, logic, means, or instructions, or any combination thereof for providing a first operating voltage from a first power management circuit of the set of one or more power management circuits to a memory array.

Aspect 9: The method, apparatus, or non-transitory computer-readable medium of aspect 8, further including operations, features, circuitry, logic, means, or instructions, or any combination thereof for providing a second operating voltage from a second power management circuit of the set of one or more power management circuits to the controller.

Aspect 10: The method, apparatus, or non-transitory computer-readable medium of any of aspects 1 through 9, where activating the second switching circuit isolates the set of one or more power management circuits from a second bus coupled with the controller and the second switching circuit.

It should be noted that the methods described herein describe possible implementations, and that the operations and the steps may be rearranged or otherwise modified and that other implementations are possible. Further, portions from two or more of the methods may be combined.

An apparatus is described. The following provides an overview of aspects of the apparatus as described herein:

Aspect 11: An apparatus, including: a set of one or more power management circuits configured to provide one or more operating voltages for the apparatus; an interface coupled with a controller via a bus; a first switching circuit configured to isolate the bus from the controller and to couple the bus with a second switching circuit; and the second switching circuit configured to isolate the set of one or more power management circuits from the controller and to couple the set of one or more power management circuits with the first switching circuit, the first switching circuit and the second switching circuit for programming the set of one or more power management circuits.

Aspect 12: The apparatus of aspect 11, where the bus is configured to communicate programming signals to the set of one or more power management circuits via the first switching circuit and the second switching circuit.

Aspect 13: The apparatus of any of aspects 11 through 12, further including: a second bus coupled with the controller and configured to communicate control signals to the set of one or more power management circuits, where the second switching circuit is configured to isolate the set of one or more power management circuits from the second bus.

Aspect 14: The apparatus of any of aspects 11 through 13, further including: a pin included in the interface and coupled with the first switching circuit and the second switching circuit.

Aspect 15: The apparatus of aspect 14, further including: a buffer gate coupled with the pin, the first switching circuit, and the second switching circuit and configured to isolate the pin from the first switching circuit and the second switching circuit.

Aspect 16: The apparatus of aspect 15, further including: a logic gate coupled with the set of one or more power management circuits and configured to receive an indication that the set of one or more power management circuits is successfully programmed, where the buffer gate is configured to isolate the pin from the first switching circuit and the second switching circuit based on an output signal from the logic gate.

Aspect 17: The apparatus of any of aspects 14 through 16, where the pin is coupled with a control terminal of the first switching circuit that is configured to control the first switching circuit, and the pin is coupled with a control terminal of the second switching circuit that is configured to control the second switching circuit.

Aspect 18: The apparatus of any of aspects 11 through 17, further including: a power supply line configured to provide the operating voltage from the set of one or more power management circuits to the controller.

Aspect 19: The apparatus of any of aspects 11 through 18, further including: a power supply line configured to provide the operating voltage from the set of one or more power management circuits to a memory array controlled by the controller.

An apparatus is described. The following provides an overview of aspects of the apparatus as described herein:

Aspect 20: A system, including: a memory system; and a programming device coupled with the memory system and configured to cause the memory system to: activate a first switching circuit to isolate a bus from a controller and to couple the bus with a second switching circuit; activate, based on activating the first switching circuit, the second switching circuit to isolate a set of one or more power management circuits from the controller and to couple the set of one or more power management circuits with the first switching circuit; and program the set of one or more power management circuits using signals communicated from the programming device to the set of one or more power management circuits via the bus based on activating the first switching circuit and the second switching circuit.

Aspect 21: The system of aspect 20, where the programming device is configured to: apply a first voltage to a pin of the memory system that is coupled with the first switching circuit and the second switching circuit, where the first switching circuit and the second switching circuit are activated based on applying the first voltage to the pin.

Aspect 22: The system of aspect 21, where the memory system is configured to: isolate the pin from the first switching circuit and the second switching circuit based on determining that the set of one or more power management circuits has been successfully programmed.

Aspect 23: The system of any of aspects 21 through 22, where the programming device is configured to: apply a second voltage to the pin based at least in part on determining that the set of one or more power management circuits has been successfully programmed; and where the memory system is configured to: activate, based at least in part on the second voltage, the first switching circuit to couple the bus with the controller and to isolate the bus from the second switching circuit.

Aspect 24: The system of aspect 23, where the memory system is further configured to: activate, based at least in part on the second voltage, the second switching circuit to couple the set of one or more power management circuits with the controller and to isolate the set of one or more power management circuits from the first switching circuit.

Aspect 25: The system of any of aspects 20 through 24, where the memory system is configured to: activate, based on determining that the set of one or more power management circuits has been successfully programmed, the first switching circuit to isolate the set of one or more power management circuits from the bus and to couple the bus with the controller.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (e.g., in conductive contact with, connected with, coupled with) one another if there is any electrical path (e.g., conductive path) between the components that can, at any time, support the flow of signals (e.g., charge, current, voltage) between the components. At any given time, a conductive path between components that are in electronic communication with each other (e.g., in conductive contact with, connected with, coupled with) may be an open circuit or a closed circuit based on the operation of the device that includes the connected components. A conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components (e.g., over a conductive path) to a closed-circuit relationship between components in which signals are capable of being communicated between components (e.g., over the conductive path). When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The terms "layer" and "level" used herein refer to an organization (e.g., a stratum, a sheet) of a geometrical structure (e.g., relative to a substrate). Each layer or level may have three dimensions (e.g., height, width, and depth) and may cover at least a portion of a surface. For example, a layer or level may be a three dimensional structure where two dimensions are greater than a third, e.g., a thin-film. Layers or levels may include different elements, components, or materials. In some examples, one layer or level may be composed of two or more sublayers or sublevels.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component (e.g., a transistor) discussed herein may represent a field-effect transistor (FET), and may comprise a three-terminal component including a source (e.g., a source terminal), a drain (e.g., a drain terminal), and a gate (e.g., a gate terminal). The terminals may be connected to other electronic components through conductive materials (e.g., metals, alloys). The source and drain may be conductive, and may comprise a doped (e.g., heavily-doped, degenerate) semiconductor region. The source and drain may be separated by a doped (e.g., lightly-doped) semiconductor region or channel. If the channel is n-type (e.g., majority carriers are electrons), then the FET may be referred to as a n-type FET. If the channel is p-type (e.g., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to provide an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions (e.g., code) on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a processor, such as a DSP, an ASIC, an FPGA, discrete gate logic, discrete transistor logic, discrete hardware components, other programmable logic device, or any combination thereof designed to perform the functions described herein. A processor may be an example of a microprocessor, a controller, a microcontroller, a state machine, or any type of processor. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a computer, or a processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. An apparatus, comprising:
a set of one or more power management circuits configured to provide one or more operating voltages for the apparatus;
an interface coupled with a controller via a bus;
a first switching circuit configured to isolate the bus from the controller and to couple the bus with a second switching circuit;
the second switching circuit configured to isolate the set of one or more power management circuits from the controller and to couple the set of one or more power management circuits with the first switching circuit, the first switching circuit and the second switching circuit for programming the set of one or more power management circuits; and
a second bus coupled with the controller and configured to communicate control signals to the set of one or more power management circuits, wherein the second switching circuit is configured to isolate the set of one or more power management circuits from the second bus.

2. The apparatus of claim 1, wherein the bus is configured to communicate programming signals to the set of one or more power management circuits via the first switching circuit and the second switching circuit.

3. The apparatus of claim 1, further comprising:
a pin included in the interface and coupled with the first switching circuit and the second switching circuit.

4. The apparatus of claim 3, further comprising:
a buffer gate coupled with the pin, the first switching circuit, and the second switching circuit and configured to isolate the pin from the first switching circuit and the second switching circuit.

5. The apparatus of claim 4, further comprising:
a logic gate coupled with the set of one or more power management circuits and configured to receive an indication that the set of one or more power management circuits is successfully programmed, wherein the buffer gate is configured to isolate the pin from the first switching circuit and the second switching circuit based on an output signal from the logic gate.

6. The apparatus of claim 3, wherein the pin is coupled with a control terminal of the first switching circuit that is configured to control the first switching circuit, and wherein the pin is coupled with a control terminal of the second switching circuit that is configured to control the second switching circuit.

7. The apparatus of claim 1, further comprising:
a power supply line configured to provide the one or more operating voltages from the set of one or more power management circuits to the controller.

8. The apparatus of claim 1, further comprising:
a power supply line configured to provide the one or more operating voltages from the set of one or more power management circuits to a memory array controlled by the controller.

9. A method, comprising:
activating a first switching circuit to isolate a bus from a controller and to couple the bus with a second switching circuit;
activating, based on activating the first switching circuit, the second switching circuit to isolate a set of one or more power management circuits from the controller and to couple the set of one or more power management circuits with the first switching circuit, wherein activating the second switching circuit isolates the set of one or more power management circuits from a second bus coupled with the controller and the second switching circuit; and
programming the set of one or more power management circuits using signals communicated via the bus based on activating the first switching circuit and the second switching circuit.

10. The method of claim 9, wherein the bus is coupled with an interface, the method further comprising:
applying a first voltage to a pin, of the interface, that is coupled with the first switching circuit and the second switching circuit, wherein the first switching circuit and the second switching circuit are activated based on applying the first voltage to the pin.

11. The method of claim 10, further comprising:
isolating the pin from the first switching circuit and the second switching circuit based on determining that the set of one or more power management circuits has been successfully programmed.

12. The method of claim 10, further comprising:
applying a second voltage to the pin based at least in part on determining that the set of one or more power management circuits has been successfully programmed; and
activating, based at least in part on applying the second voltage, the first switching circuit to couple the bus with the controller and to isolate the bus from the second switching circuit.

13. The method of claim 12, further comprising:
activating, based at least in part on applying the second voltage, the second switching circuit to couple the set of one or more power management circuits with the controller and to isolate the set of one or more power management circuits from the first switching circuit.

14. The method of claim 9, further comprising:
providing a first operating voltage from a first power management circuit of the set of one or more power management circuits to a memory array.

15. The method of claim 14, further comprising:
providing a second operating voltage from a second power management circuit of the set of one or more power management circuits to the controller.

16. A method, comprising:
activating a first switching circuit to isolate a bus from a controller and to couple the bus with a second switching circuit;
activating, based on activating the first switching circuit, the second switching circuit to isolate a set of one or more power management circuits from the controller and to couple the set of one or more power management circuits with the first switching circuit;
programming the set of one or more power management circuits using signals communicated via the bus based on activating the first switching circuit and the second switching circuit;
activating, based on determining that the set of one or more power management circuits has been successfully programmed, the first switching circuit to isolate the set of one or more power management circuits from the bus and to couple the bus with the controller; and
activating, based on determining that the set of one or more power management circuits has been successfully programmed, the second switching circuit to isolate the set of one or more power management circuits from the first switching circuit and to couple the second switching circuit with the controller.

17. A system, comprising:
a memory system; and
a programming device coupled with the memory system and configured to cause the memory system to:
activate a first switching circuit to isolate a bus from a controller and to couple the bus with a second switching circuit;
activate, based on activating the first switching circuit, the second switching circuit to isolate a set of one or more power management circuits from the controller and to couple the set of one or more power management circuits with the first switching circuit, wherein activating the second switching circuit isolates the set of one or more power management circuits from a second bus coupled with the controller and the second switching circuit; and
program the set of one or more power management circuits using signals communicated from the programming device to the set of one or more power management circuits via the bus based on activating the first switching circuit and the second switching circuit.

18. The system of claim 17, wherein the programming device is configured to:
apply a first voltage to a pin of the memory system that is coupled with the first switching circuit and the second switching circuit, wherein the first switching circuit and the second switching circuit are activated based on applying the first voltage to the pin.

19. The system of claim 18, wherein the memory system is configured to:
isolate the pin from the first switching circuit and the second switching circuit based on determining that the set of one or more power management circuits has been successfully programmed.

20. The system of claim 18, wherein the programming device is configured to:
apply a second voltage to the pin based at least in part on determining that the set of one or more power management circuits has been successfully programmed; and wherein the memory system is configured to:
activate, based at least in part on the second voltage, the first switching circuit to couple the bus with the controller and to isolate the bus from the second switching circuit.

21. The system of claim 20, wherein the memory system is further configured to:
activate, based at least in part on the second voltage, the second switching circuit to couple the set of one or more power management circuits with the controller and to isolate the set of one or more power management circuits from the first switching circuit.

22. The system of claim 17, wherein the memory system is configured to:
activate, based on determining that the set of one or more power management circuits has been successfully programmed, the first switching circuit to isolate the set of one or more power management circuits from the bus and to couple the bus with the controller.

* * * * *